United States Patent [19]

Wyland

[11] Patent Number: 5,289,062
[45] Date of Patent: Feb. 22, 1994

[54] FAST TRANSMISSION GATE SWITCH

[75] Inventor: David C. Wyland, San Jose, Calif.

[73] Assignee: Quality Semiconductor, Inc., Santa Clara, Calif.

[21] Appl. No.: 35,873

[22] Filed: Mar. 23, 1993

Related U.S. Application Data

[63] Continuation of Ser. No. 967,956, Oct. 27, 1992, abandoned, which is a continuation of Ser. No. 859,289, Mar. 25, 1992, abandoned, which is a continuation of Ser. No. 672,050, Mar. 18, 1991, abandoned.

[51] Int. Cl.$^5$ .......................................... H03K 17/687
[52] U.S. Cl. .................................... 307/577; 307/571; 307/574
[58] Field of Search ............... 307/571, 572, 574, 577, 307/253, 254, 248

[56] References Cited

U.S. PATENT DOCUMENTS

| | | | |
|---|---|---|---|
| 3,184,609 | 5/1965 | Yee . | |
| 3,614,472 | 10/1971 | Kloppenborg | 307/249 |
| 3,617,771 | 11/1971 | Lee | 307/254 |
| 4,004,160 | 1/1977 | Streit et al. | 307/253 |
| 4,096,399 | 6/1978 | Davis et al. | 307/249 |
| 4,628,307 | 12/1986 | Crouse | 307/571 |
| 4,656,647 | 4/1987 | Hotine | 375/52 |
| 4,704,550 | 11/1987 | Hechtman | 307/571 |
| 4,716,398 | 12/1987 | Eccleston et al. | 307/571 |
| 4,716,514 | 12/1987 | Patel | 363/127 |
| 4,719,374 | 1/1988 | Bialo | 307/571 |
| 4,810,911 | 3/1989 | Noguchi | 307/243 |
| 4,814,644 | 3/1989 | Yamakawa | 307/571 |
| 4,959,873 | 9/1990 | Flynn et al. | 307/571 |
| 4,963,773 | 10/1990 | Ayasli | 307/304 |
| 5,012,123 | 4/1991 | Ayasli et al. | 307/254 |
| 5,038,051 | 8/1991 | Firman et al. | 307/254 |
| 5,061,903 | 10/1991 | Vasile | 330/311 |
| 5,107,152 | 4/1992 | Jain et al. | 307/571 |

Primary Examiner—John Zazworsky
Assistant Examiner—Terry D. Cunningham
Attorney, Agent, or Firm—Wilson, Sonsini, Goodrich & Rosati

[57] ABSTRACT

A fast switching device for passing or blocking signals between two input/output ports includes a transistor having a first and a second terminal and a control terminal. The first and second terminals are connected between the two ports. The transistor passes signals between the ports when the transistor is turned on and blocks the passage of signals between the ports when the transistor is turned off. The resistance between the first and second terminals is less than about 10 ohms when the transistor is turned on. The device further includes a driver for controlling the control terminal of the transistor for turning it on or off. Preferably the capacitance between the first or second terminal and a reference potential is less than about 50 pF.

6 Claims, 6 Drawing Sheets

FAST TRANSMISSION GATE SWITCH

This application is a continuation of application Ser. No. 07/967,956, filed Oct. 27, 1992, now abandoned, which is a continuation of No. 07/859,289 filed Mar. 25, 1992, now abandoned, which is a continuation of No. 07/672,050 filed Mar. 18, 1991, now abandoned.

BACKGROUND OF THE INVENTION

This invention relates in general to signal switches and in particular, to a fast transmission gate switch, particularly useful for switching digital logic signals.

With the advent of very large-scale integrated circuits, the size of devices manufactured has been shrinking and the speed of the devices has continually increased. Most of the efforts, however, have been directed to designs where many circuits and the connections between them are made in the same medium such as a silicon chip. Since all the circuit components being fabricated are done in the same medium, devices may be made smaller by improved techniques such as improved lithography. By reducing the sizes of the devices and the lengths of the connections between them, the speed of the device is increased due to a decrease in the inductances, resistances and capacitances of individual devices and of the connections between them.

Board level designs have not kept pace with the above-described development in very large-scale integrated circuits. Printed circuit board designs frequently have large capacitances which slow down signal propagation. Thus if two high speed logic chips are connected through a slower device, the overall speed of the system is determined by the slowest component, namely, the slow connecting device. Passive switching devices such as transmission gates have been used in printed circuit board level designs for switching signals between digital logic devices. The slow speed of this type of switches determines the speed of signal transmission even though the two logic devices may operate at much higher speeds. It is therefore desirable to provide a stand-alone switching device which is much faster than the conventional passive transmission gate.

In one type of improved switching circuits that is frequently used, instead of a passive switch, an active device such as a logic buffer is used. While a buffer used as a switch causes a delay that is less than that caused by the conventional passive transmission gate switch, the delay caused by such buffers may nevertheless be excessive and undesirable for some high speed applications. It is thus desirable to provide a high speed switch that causes less delay than the above described switches.

SUMMARY OF THE INVENTION

The switching device of this invention has two input/output ports for passing or blocking signals between the two ports of the device. The device comprises a transistor having a first and a second terminal and a control terminal. The first and second terminals are connected between the two ports. The transistor thereby passes signals between the two ports when the transistor is turned on and blocks the passage of signals between the two ports when the transistor is turned off. The resistance between the first and second terminals is less than about 10 ohms when the transistor is turned on. The device further comprises means for applying a switching signal to the control terminal of the transistor for turning it on or off. In the preferred embodiment, the capacitance between the first or second terminal and a reference potential is less than about 50 pF when the transistor is turned on.

DETAILED DESCRIPTION OF THE PREFERRED EMBODIMENT

Figure 1:
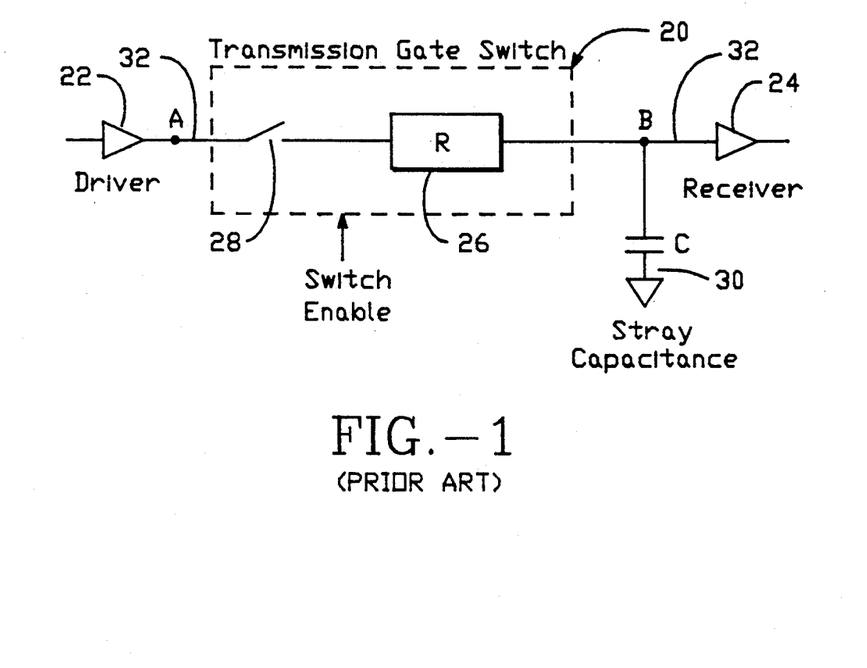
FIG. 1 is a schematic circuit diagram of a passive transmission gate switch illustrating a conventional design.

FIG. 1 is a schematic circuit diagram of a conventional transmission gate switch 20 connected to the output of a driver 22 and the input of a receiver 24 at nodes A, B respectively. The signal to be switched appears at the output of driver 22. When switch 20 connects nodes A and B, such signal is transmitted to node B and appears at the input of receiver 24. Driver 22 and receiver 24 may each be part of another circuit chip package mounted on a printed circuit board where switch 20 is connected by conductive traces through nodes A, B to these chip packages.

Switch 20 has resistance R so that the switch may be represented conceptually as a resistor 26 in series with a pure switch 28 as shown in FIG. 1. The conductive traces 32 connecting switch 20 to driver 22 and receiver 24 have inherent capacitances and so does receiver 24 as seen by a signal propagating between nodes A and B. The transmission gate switch 20 itself also has capacitance. The total capacitance of the conductive traces, receiver 24 and switch 20 as seen by a signal propagating from A to B is commonly known as the stray capacitance and is represented conceptually as capacitor 30 in FIG. 1. Thus a measure of the delay of the signal propagating from node A to node B is given by the RC time constant, or the product of the resistance of resistor 26 and the capacitance of capacitor 30.

Figure 2:
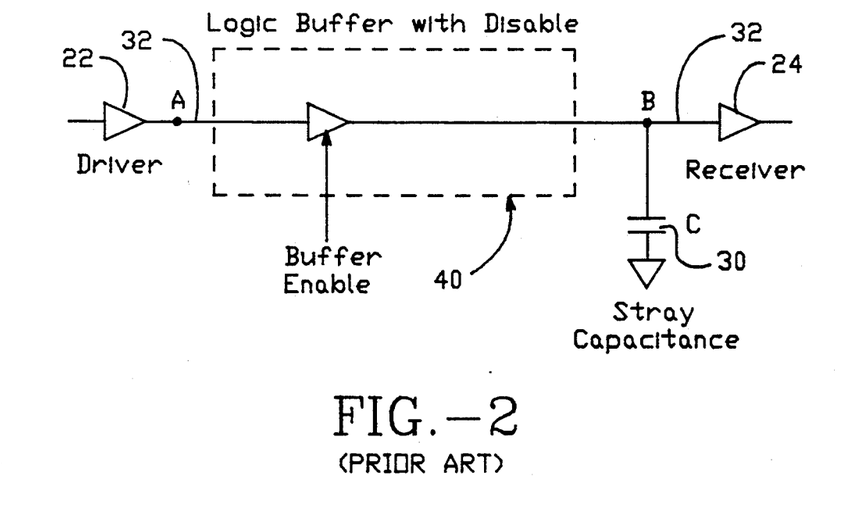
FIG. 2 is a schematic view of an active switch device using an enabled buffer to illustrate another conventional design.

For typical printed circuit board designs, a typical stray capacitance value exclusive of the effect of the switch itself is about 50 pF. Therefore, if switch 20 has a large resistance value, the RC time constant will be large, resulting in a significant signal delay when the signal propagates from A to B. A standard transmission gate switch is CMOS 4016 integrated circuit. The typical resistance values of existing transmission gate switches such as the 4016 are in the range of 100–1,000 ohms. This type of switches would therefore introduce a delay of the order of 50–500 nanoseconds, assuming a 50 pF stray capacitance. Such delay is unacceptable for switching high speed signals required in many computer and logic applications. For is reason, the 4016 type switch is more commonly used in analog circuits and seldom in board level computer or digital logic designs. For the latter applications, active logic devices such as industry standard 74F244 buffers have been used such as shown in FIG. 2. To simplify the discussion, identical components and the figures of this application are identified by the same numerals.

As shown in FIGS. 1 and 2, transmission gate switch 20 has been replaced by a logic buffer 40 in FIG. 2. Driver 22 and receiver 24 may be part of computer or logic chip packages mounted on a printed circuit board and connected to buffer 40 by conductive traces 32 on the board. Buffer 40, however, introduces a delay of its own because of the inherent speed limitations of active logic. The 74F244 buffer introduces a delay of about 6.5 nanoseconds. Thus while using a logic buffer 40 to replace switch 20 does reduce the delay in signal transmission, it is difficult to further reduce the delay introduced by the buffer itself. It is therefore desirable to provide an improved switching device where the above-described difficulties are alleviated.

This invention is based on the observation that, by employing a transistor having low inherent resistance, the signal delay of the switch can be further reduced to a value much below that of the active buffers in FIG. 2.

Figure 3:
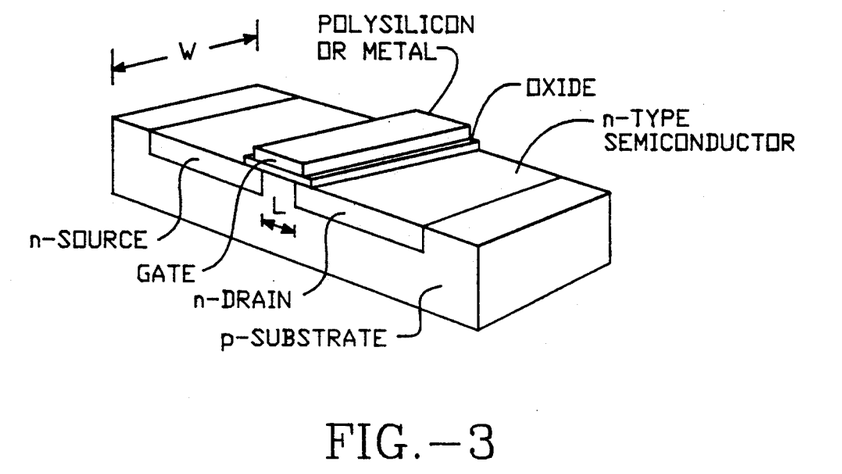
FIG. 3 is a perspective view of a MOS transistor useful for illustrating the invention.
Figure 4:
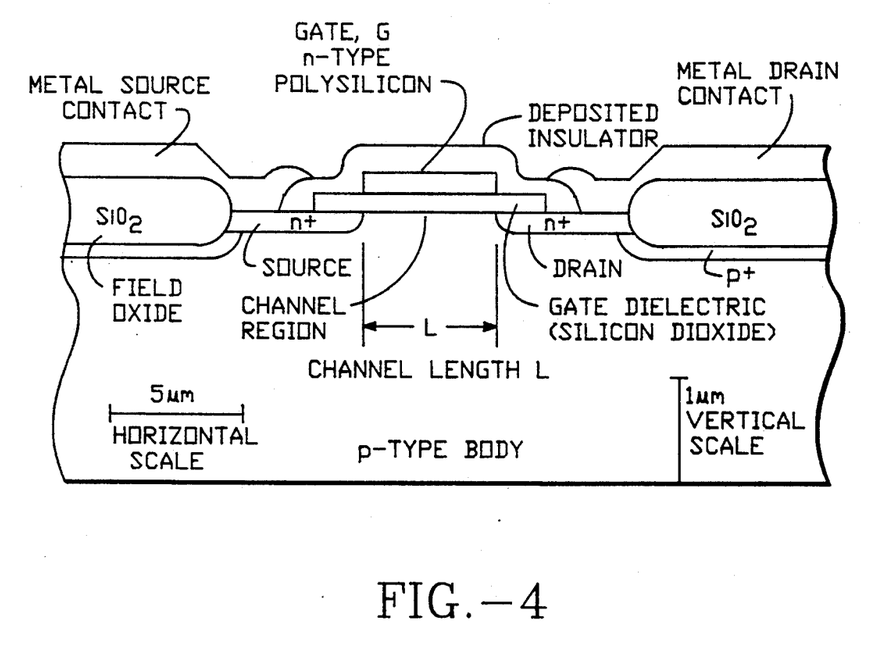
FIG. 4 is a cross-sectional view of the transistor of FIG. 3.

FIG. 3 is a perspective view of a MOS transistor useful for illustrating the invention. FIG. 4 is a cross-sectional view of the transistor of FIG. 3. As shown in FIGS. 3 and 4, the channel length of a MOS type transistor is the distance L between the source and drain regions of the transistor while the channel width is the dimension W of the transistor in the direction where the cross-sectional configuration of the transistor does not change. Another common definition of the channel length is the width of the gate that overlaps the active region of the transistor between the source and drain. Another common definition of the channel width is the length of the gate overlapping the active region of the transistor between the source and drain.

Figure 5:
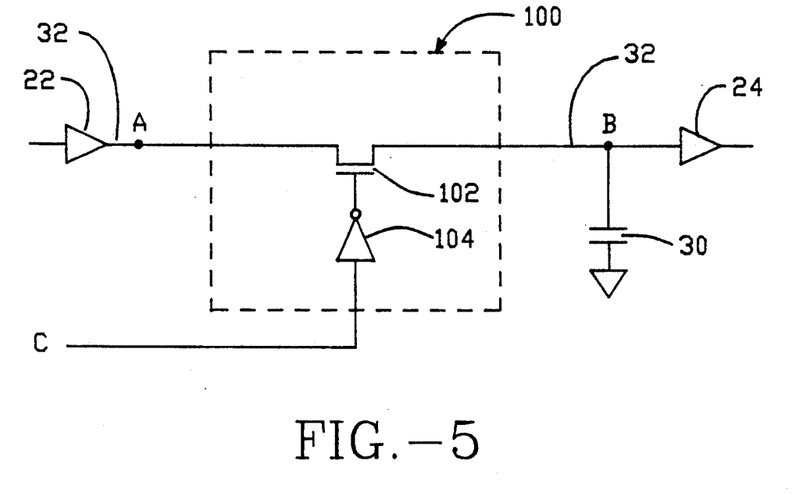
FIG. 5 is a schematic circuit diagram of a transmission gate switch and of a driver and receiver to illustrate the preferred embodiment of the invention.

FIG. 5 is a schematic circuit diagram of a transmission gate switch and of a driver and receiver to illustrate the preferred embodiment of the invention. As shown in FIG. 5, the transmission gate 100 includes a N-channel MOS transistor 102 and a driver 104 for controlling the gate of transistor 102 in response to an external signal from node C. The channel length of transistor 102 is not more than 1.5 microns, preferably not more than 1 micron. The channel width of transistor 102 is more than about 1,000 microns and preferably 1,200 microns or more. In reference to FIGS. 3 and 4, by reducing the channel length, the resistance of the resistor is reduced since current carriers have a shorter distance to travel in order to conduct current between nodes A, B. By using a transistor with large channel width compared to the transistors in the 4016 type gate, the resistance of transistor 102 is further reduced in comparison. With the above-described design for transistor 102, it is found that the inherent resistance of transmission gate switch 100 between nodes A, B when the transistor 102 is turned on (on-resistance) can be reduced to a value of no more than 10 ohms. Applicant has discovered that in some designs, the resistance of switch 100 when transistor 102 is turned on may be reduced to a value in the range of 2–3 ohms. Shorter channel lengths also results in reduced capacitance of transistor 102. A typical capacitance value of switch 100 is in the range of a few pF and is not significant compared to the typical stray capacitance of 50 pF. Thus, it is preferable for the capacitance of the transistor as seen at terminals A or B to be 50 pF or less, so that the switch itself does not introduce too much of a signal delay. Such capacitance is, of course, measured at terminals A or B in reference to ground or another reference potential.

The above-described transmission gate switch 100 may be used to advantageously replace active logic devices such as 74F244, 74F245 for switching high speed digital logic signals in a board level design. The replacement of the active device with device 100 will greatly reduce the propagation delay, logic noise (e.g., "ground bounce" noise) and power dissipation associated with the active device replaced. Switch 100 is also inherently bi-directional. Other embodiments of the switch described below in reference to FIGS. 5–8 also have similar advantages.

Switch 100 may be modified by replacing transistor 102 by a P-channel transistor where the polarity of the signal for controlling the gate of the transistor has been adjusted if necessary to accommodate a P-channel device. Where the P-channel device also has the above-described channel lengths and widths, switch 100 may be constructed to have a on-resistance of not more than 10 ohms.

The gate of transistor 102 is controlled by the output of a driver 104 which may include a pair of P-channel and N-channel resistors connected in parallel between node C and the gate of transistor 102. In order to increase the speed of switching, the pair of transistors in driver 104 would preferably each have a channel length of 1.5 microns or less. Where a driver 104 and transistor 102 are fabricated as a stand-alone integrated circuit device 100 using the same fabrication technology, the transistors in device 100 may be grown so that all the transistors in the device have short channel lengths. Where device 100 is fabricated as an integrated circuit, it can be made in the form of a package having three pins for connection to nodes A, B and C.

Figure 6:
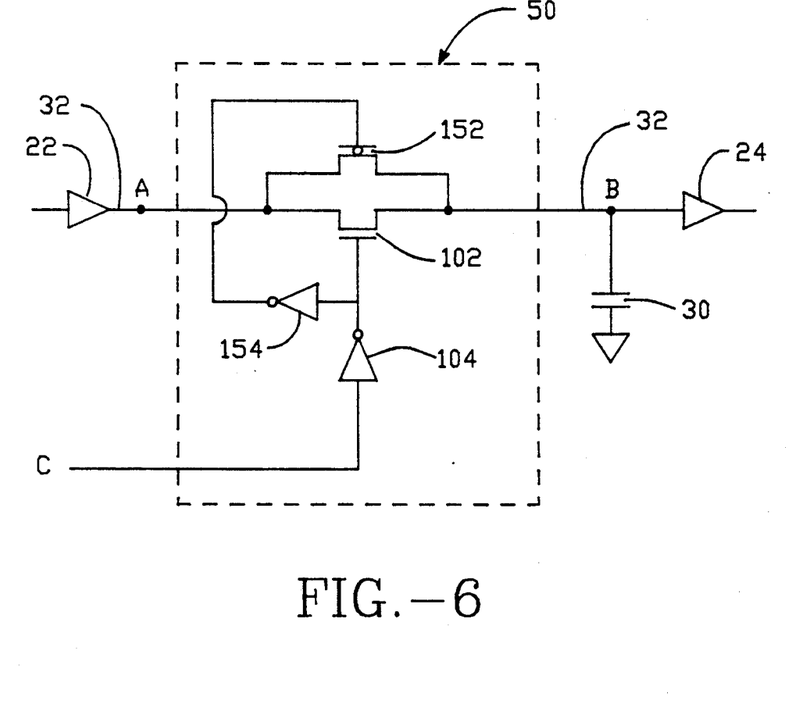
FIG. 6 is a schematic circuit diagram of a transmission gate switch and of a driver and receiver to illustrate an alternative embodiment of the invention.

FIG. 6 is a schematic circuit diagram of a transmission gate switch and of a driver and receiver to illustrate an alternative embodiment of the invention. As shown in FIG. 6, switch 150 includes a pair of N-channel transistor 102 and a P-channel transistor 152 connected in parallel between nodes A, B. The gate of transistor 102 is controlled by a driver 104 as in FIG. 5 and the gate of transistor 152 is controlled by the output of driver 154 whose input is connected to the output of driver 104. Where both transistors 102, 152 have the channel lengths and widths as those described above for transistor 102, the on-resistance of switch 150 would be 10 ohms or less.

Figure 7:
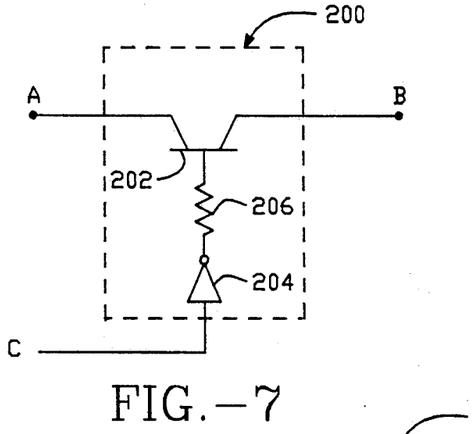
FIGS. 7 and 8 are schematic circuit diagrams of two different transmission gate switches to illustrate additional alternative embodiments of the invention.
Figure 8:
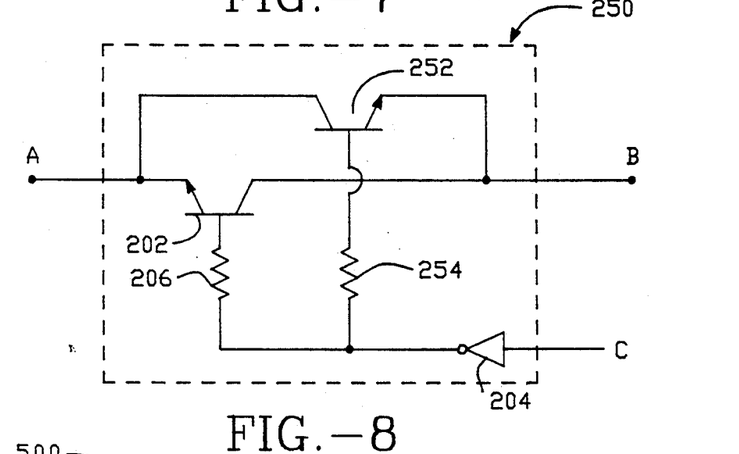

FIGS. 7 and 8 are schematic circuit diagrams of two different transmission gate switches to illustrate additional alternative embodiments of the invention. Bipolar transistors typically have on-resistances of less than 10 ohms so that they may be used instead of MOS transistor 102. Such configuration is illustrated in switch 200 of FIG. 7. While a npn transistor 202 is employed in switch 200, it will be understood that a pnp type transistor may be used instead and is within the scope of the invention. As shown in FIG. 7, the base of transistor 202 is controlled by the output of a driver 204 through resistor 206. Driver 204 may be one of the 7400 TTL series of logic gates, such as the 74F04 gate.

In FIG. 8, a back to back connection of two npn transistors 202 and 252 are shown for switch 250, although 2 pnp transistors may be used instead. It is known that for a bipolar transistor, unlike a MOS transistor, the current flowing between the collector and emitter is greater in one direction than the other. By placing two transistors 202, 252 in two parallel paths and connected to nodes A, B so that each node is connected to a collector of one transistor and the emitter of the other transistor, currents will flow through the path of lesser resistance in each direction so that the amount of current that needs to be pumped through the switch is reduced.

Figure 9:
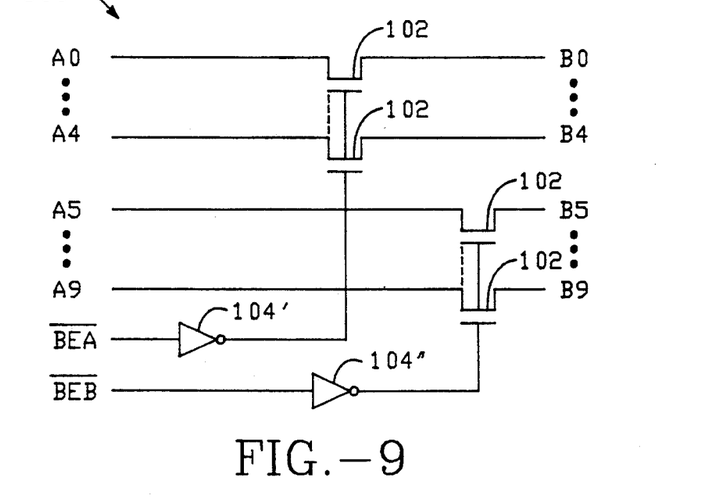
FIG. 9 is a schematic view of a bus switch for switching signals between two sets of bus lines to illustrate applications of the invention.

FIG. 9 is a schematic circuit diagram of a CMOS bus switch device employing the invention for switching the signals between two sets of bus lines. Quality Semiconductor, Inc. of Santa Clara, Calif., assignee of the present application, has employed the present invention for bus switches such as one shown in FIG. 9 in product 74FCT3384. As shown in FIG. 9, switch device 500 is a high speed TTL bus connect device. When enabled, the bus switch device directly connects two buses with the connection resistance of less than 5 ohms. The five lines A0, A1, A2, A3, A4 in bus A are each connected through a transistor 102 to the bus lines B0, B1, B2, B3, B4 respectively. The five transistors 102 connecting A0-A4 to B0-B4 have their gates controlled by the output of driver 104'. Similarly, the five lines A5-A9 in bus A are connected to the respective one of the five bus lines B5-B9 in bus B through transistors 102 whose gates are controlled by the outputs of a driver 104". Thus switch device 500 includes ten switches 102 arranged as two banks of five and controlled by two different drivers. This allows switch device 500 to be used as a 10-bit switch or as a 5-bit, 2-to-1 multiplexer. This is accomplished by electrically connecting the pairs of lines B0-B5, B1-B6, B2-B7, B3-B8 and B4-B9. In such event, when the output of driver 104' is high, the signals present on lines A0-A4 will be transmitted to the B bus whereas if the output of driver 104" is high, the signals present on lines A5-A9 will be transmitted to the B bus instead to accomplish the 2-to-1 multiplexer function. When the output of one of the two drivers is low, the transistors driven by the driver will be turned off and the respective bus lines connected by such transistors are disconnected from one another. The above-described function is summarized in the Function Table below.

Function TABLE:

| BEA | BEB | B0-4 | B5-9 | Function |
|-----|-----|------|------|----------|
| H | H | Hi-Z | Hi-Z | Disconnect |
| L | H | A0-4 | Hi-Z | Connect |
| H | L | Hi-Z | A5-9 | Connect |
| L | L | A0-4 | A5-9 | Connect |

Device 500 includes in essence ten switches, where each switch includes an N-channel MOS transistor driven by a CMOS gate. When the switch is enabled, the gate of the N-channel transistor is at Vcc (+5 volts) and the device is on. These devices have an on resistance of less than 5 ohms for voltages near ground and will drive in excess of 64 mA each. The resistance rises somewhat as the I/O voltage rises from a TTL low of 0.0 volts to a TTL high of 2.4 volts. In this region the A and B pins are solidly connected, and the bus switch is specified in the same manner as a TTL device over this range. As the I/O voltage rises to approximately 4.0 volts, the transistor turns off. This corresponds to a typical TTL high of 3.5 to 4.0 volts.

Figure 10:
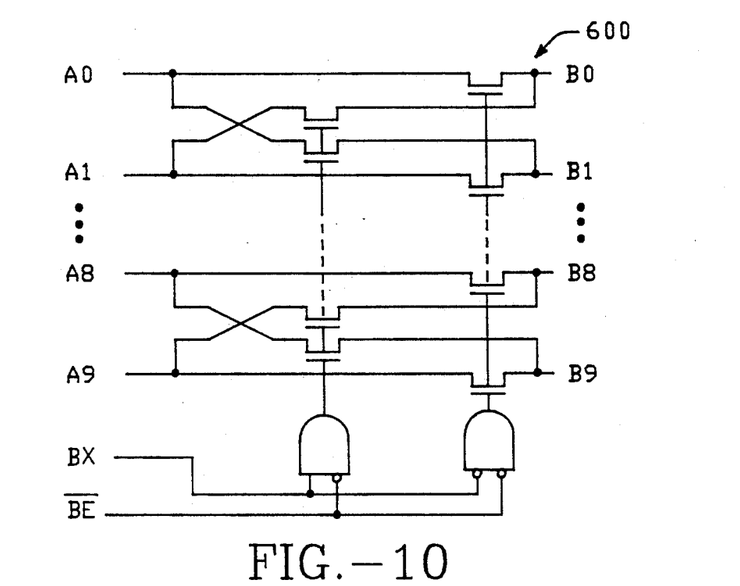
FIG. 10 is a schematic circuit diagram of a bus exchange switch to illustrate applications of the invention.

FIG. 10 is a schematic circuit diagram of a CMOS bus exchange switch 600 in another product 74FCT3383. Switch 600 comprises two banks of ten switches arranged to gate through or exchange two banks of five signals. This allows switch 600 to be used as a 10-bit switch or as a 5-bit, two-way bus exchange device. Switch 600 is particularly useful for exchange and routing operations such as byte swap, crossbar matrices, and RAM sharing. The functions of switch 600 are summarized in the Table below.

Function TABLE:

| BE | BX | B0-8 | B1-9 | Function |
|----|----|------|------|----------|
| H | X | Hi-Z | Hi-Z | Disconnect |
| L | L | A0-8 | A1-9 | Connect |
| L | H | A1-9 | A0-8 | Exchange |

Figure 11A:
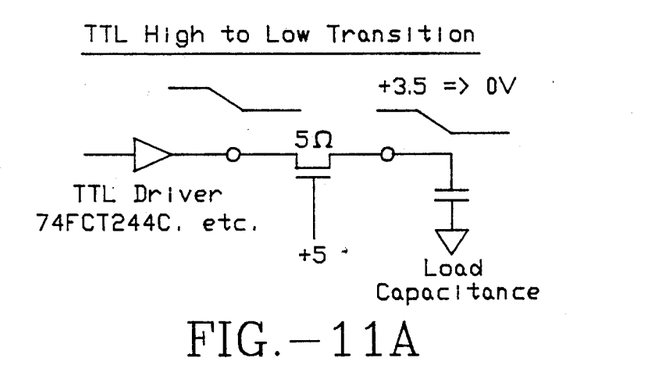
FIGS. 11A, 11B are schematic circuit diagrams illustrating the operation of the circuit in FIG. 5.
Figure 11B:
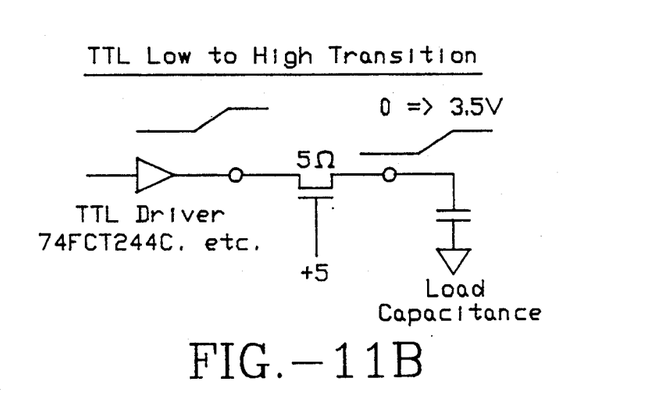

The bus switch provides a path for a driving device to drive capacitance to ground and to drive capacitance up from ground. This is shown in FIGS. 11A, 11B. When the A (or B) input is driven to a TTL low of 0.0 volts, the N-channel transistor is fully on and the B (or A) output will follow it. Likewise, when the A (or B) input is driven from a TTL low of 0.0 volts to a TTL high, the capacitor side of the N-channel switch is at 0.0 volts, the switch is fully on and the B (or A) output will follow it through threshold and beyond. This means that the rise and fall time characteristics and waveforms of the B (or A) output will be determined by the TTL driver, not the bus switch. The switch introduces insignificant propagation delay.

When the bus switch is disabled, the N-channel transistor gate is at 0.0 volts, and the transistor is off. By the nature of the N-channel transistor design, the A and B pins are fully isolated when the transistor is off. Leakage and capacitance is to the chip substrate (i.e., ground) rather than between input and output. This minimizes feedthrough in the off state. Because only an N-channel transistor is used, either A or B pin(s) can be taken to Vcc and above, and the device can be powered down without loading either bus.

The bus switch can replace drivers and transceivers in systems if bus repowering is not required. Since the bus switch directly connects two buses, it provides no drive of its own but relies on the device that is driving data onto the connected buses. If the additional loading of the connected bus is small enough, there is a net gain in speed. For example, the sensitivity to loading of a driver such as the 74FCT244 is typically 2 ns/100 pF. If the connected bus adds 50 pF of loading the added delay will be 1 ns. This is much less than the 4-10 ns delay of the buffer or transceiver the bus switch replaces.

Figure 12A:
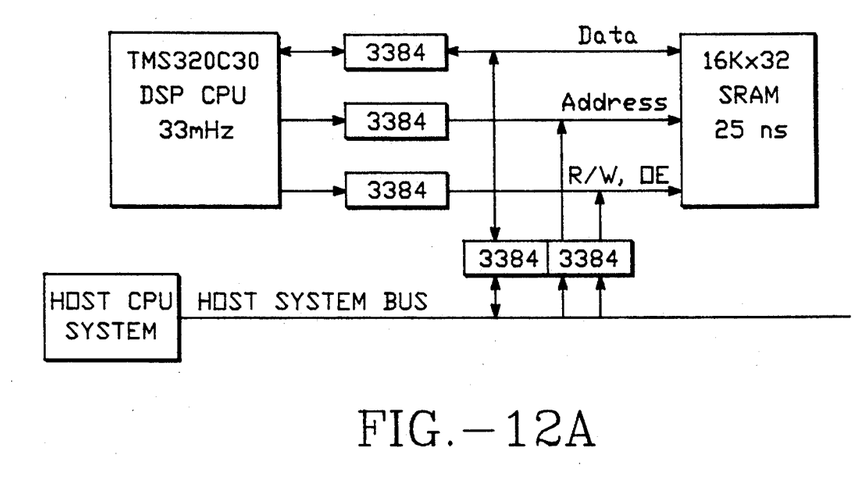
FIG. 12A is a block diagram of a computer system illustrating the applications of the invention.

FIG. 12A shows bus switches (labeled 3384) of the type in FIG. 9 used to allow the memory for a DSP slave processor to be accessed by the host processor. A 33 mHz TMS320C30 system is shown with a 16K×32 SRAM as its program and data storage memory. The SRAM is connected to the DSP CPU by a 3384 device, allowing full speed operation while the CPU is running.

Figure 12B:
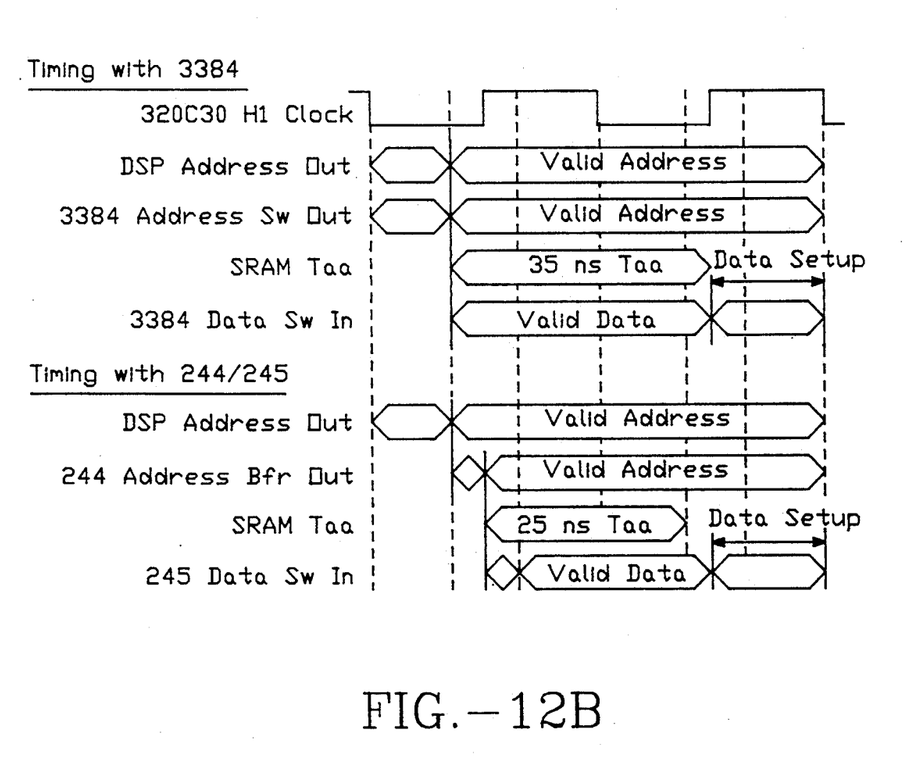
FIG. 12B is a timing diagram illustrating the operation of the system in FIG. 12A.

This saves 10 ns over using conventional fast buffers and transceivers, i.e., 5 ns for a 244 address buffer to the SRAM and 5 ns for a 245 address transceiver from the SRAM, as shown in the timing diagrams in FIG. 12B. This allows using SRAMs with 35 ns Taa (access time) instead of 25 ns. Between calculations, the 3384 devices disconnect the SRAM from the DSP CPU and connect it to the host CPU, allowing the host to write data in before the DSP calculation and read data out after.

What is claimed is:

1. A fast transmission, integrated circuit switching device responsive to at least one external on/off control signal and including a first input/output node and a second input/output node, said switching device operative to pass or block the bidirectional transmission of external data signals between said first node and said second note, said switching device comprising:
    a bidirectional field-effect transistor including a first input/output terminal and a second input/output terminal and a gate terminal, said first terminal being connected to said first node and said second terminal being connected to said second node, whereby said transistor passes bidirectional external data signals between said first and second nodes when said transistor is turned on and blocks the passage of external data signals between said first and second nodes when said transistor is turned off;
    wherein said field-effect transistor has a channel length of no more than 1.5 microns and has a channel width of no less than 1,000 microns, whereby said transistor exihibits a time constant of no more than 0.5 nanoseconds; and
    a driver circuit including an external terminal for receiving the at least one external on/off control signal;
    wherein said driver circuit provides an internal on/off control signal to said gate terminal of said field-effect transistor, whereby said transistor is turned off or on.

2. The device of claim 1, wherein said transistor is a P-channel transistor.

3. The device of claim 1, wherein said transistor is an N-channel transistor.

4. The integrated circuit switching device of claim 1 wherein the first terminal is connected directly to the first input/output node; and the second terminal is connected directly to the second input/output node.

5. A fast transmission, integrated circuit switching device responsive to at least one respective external on/off signal and including multiple respective first input/output nodes and multiple respective second input/output nodes, said switching device operative to respectively pass or block the bidirectional transmission of respective individual external data signals between respective individual first nodes and respective individual second nodes, said switching device comprising:
    at least one multiple respective field-effect transistors, each including a respective first input/output terminal and a respective second input/output terminal and a respective gate terminal, each respective first terminal being connected to a respective first node and each respective second terminal being connected to a respective second node, whereby each respective transistor respectively passes bidirectional individual external data signals between respective individual first and second input/output nodes when said respective transistor is turned on and respectively blocks the passage of individual external data signals between respective individual first and second input/output nodes when said respective transistor is turned off;
    wherein each respective field-effect transistor has a channel length of no more than 1.5 microns and has a channel width of no less than 1,000 microns, whereby each respective transistor exhibits a time constant of no more than 0.5 nanoseconds; and
    at least one driver circuit including a respective external terminal for receiving the at least one respective external on/off signal;
    wherein the at least one driver circuit provides a respective internal on/off control signal to said gate terminals of said respective one of the at least one set thereof field-effect transistors.

6. The integrated circuit switching device of claim 5 wherein each respective first terminal is directly connected to a respective individual first input/output node; and each respective second terminal is connected directly to a respective individual second input/output node.

* * * * *